(12) United States Patent
Liebler

(10) Patent No.: US 6,646,450 B2
(45) Date of Patent: Nov. 11, 2003

(54) METHOD AND APPARATUS FOR NEAR LOSSLESSLY MEASURING INDUCTOR CURRENT

(75) Inventor: Jerome E. Liebler, North Plains, OR (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 70 days.

(21) Appl. No.: 09/981,471

(22) Filed: Oct. 16, 2001

(65) Prior Publication Data

US 2003/0071636 A1 Apr. 17, 2003

(51) Int. Cl.$^7$ ............................ G01R 27/06; H02H 3/00
(52) U.S. Cl. .................... 324/630; 324/654; 361/94; 323/272
(58) Field of Search ................ 324/654, 656, 324/677, 76.75, 522, 630; 323/272, 282; 361/94

(56) References Cited

U.S. PATENT DOCUMENTS

| | | | |
|---|---|---|---|
| 5,181,155 A | * | 1/1993 | Beg et al. ................. 361/94 |
| 5,481,178 A | * | 1/1996 | Wilcox et al. ............. 323/287 |
| 6,469,481 B1 | * | 10/2002 | Tateishi .................... 323/282 |

FOREIGN PATENT DOCUMENTS

| | | |
|---|---|---|
| EP | 0 473 428 A | 3/1992 |
| WO | WO 99 57578 A | 11/1999 |

* cited by examiner

*Primary Examiner*—Jay Patidar
*Assistant Examiner*—Vincent Q. Nguyen
(74) *Attorney, Agent, or Firm*—Michael Schmitt

(57) ABSTRACT

The present invention provides an improved measuring circuit for measuring a current of an inductor with minimum losses and errors. According to one embodiment of the invention, the measuring circuit comprises an op-amp, a RC network connected in a feedback loop of the op-amp, and a scaling resistor connected in series to one of the input terminals of the op-amp. By setting the RC constant of the RC network to be equal to the ratio of the inductor value over its internal resistance value, the inductor current can be derived independent of the frequencies of AC signals.

14 Claims, 4 Drawing Sheets

METHOD AND APPARATUS FOR NEAR LOSSLESSLY MEASURING INDUCTOR CURRENT

BACKGROUND OF THE INVENTION

The invention generally relates to electronic circuits, and more particularly to methods and apparatuses for near losslessly measuring inductor current.

In switching regulators and particularly multi-phase and other advanced power converters, current through inductors must be accurately measured in order for the control circuitry to timely provide control signals for controlling the operation of the devices. A typical conventional way to measure inductor current is illustrated in FIG. 1.

As shown in FIG. 1, a sampling resistor 10 is connected in series with an inductor 12 and its internal resistance 14. The voltage Vo across sampling resistor 10 is measured by an op-amp 16. From this voltage Vo and the resistance value Rs of sampling resistor 10, the inductor current $i_L$ can be derived to be Vo/Rs. This method, however, suffers from significant losses due to the additional power consumed by sampling resistor 10, which in turn causes inefficiency in the circuit performance.

Another conventional way to measure inductor current is illustrated in FIG. 2. As shown in FIG. 2, a RC network 20 composed of a resistor 22 and a capacitor 24 is used to measure the inductor current $i_L$. In this method, the voltage across capacitor 24, Vc, is measured. This voltage Vc is taken as the voltage across the inductor 12, from which the inductor current $i_L$ is derived from the expression Vc/Rs. This approach, however, generates significant errors because the load resistance is not taken into account. Practically, this is never the case.

Therefore, there is a need for an improved way of measuring inductor current with minimum losses and errors.

SUMMARY OF THE INVENTION

The present invention provides an improved measuring circuit for measuring a current of an inductor with minimum losses and errors. According to one embodiment of the invention, the measuring circuit comprises an op-amp having first and second input terminals and an output terminal, with the second terminal for connecting a first end of the inductor; a RC network connected between the first input terminal and the output terminal of the op-amp; and a scaling resistor having a first end connected to the first input terminal of the op-amp and a second end for connecting to a second end of the inductor. In a specific embodiment, the RC network comprises a resistor and a capacitor connected to each other in parallel. According to the invention, by setting the RC constant of the RC network to be equal to the ratio of the inductor value over its internal resistance value, the inductor current can be derived independent of the frequencies of AC signals.

Other objects and attainments together with a fuller understanding of the invention will become apparent and appreciated by referring to the following description and claims taken in conjunction with the accompanying drawings.

BRIEF DESCRIPTION OF THE DRAWINGS

The invention is explained in further detail, and by way of example, with reference to the accompanying drawings wherein.

Throughout the drawings, the same reference numerals indicate similar or corresponding features or functions.

DETAILED DESCRIPTION OF THE PREFERRED EMBODIMENTS

Figure 1:
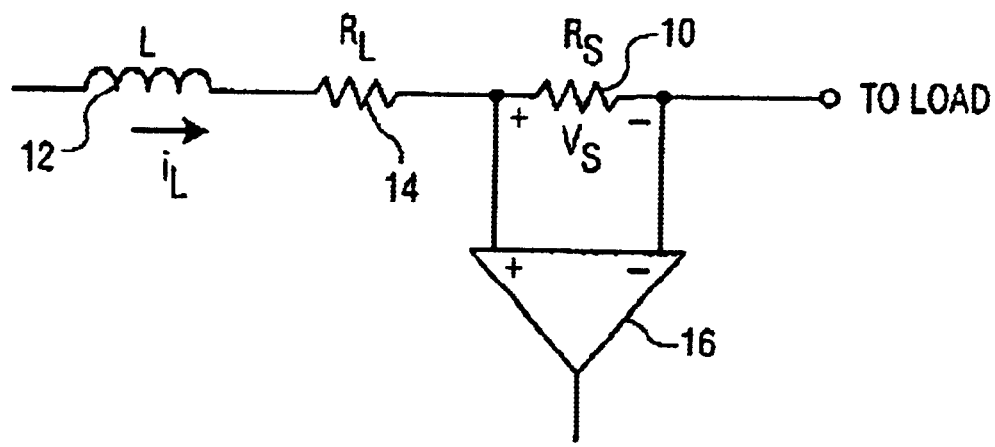
FIG. 1 illustrates a typical conventional way to measure inductor current.
Figure 2:
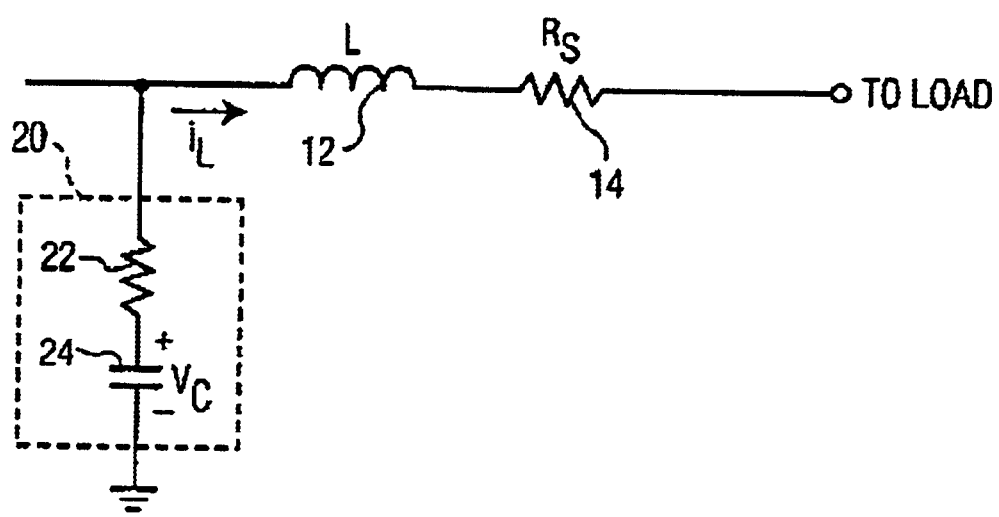
FIG. 2 illustrates another conventional way to measure inductor current.
Figure 3:
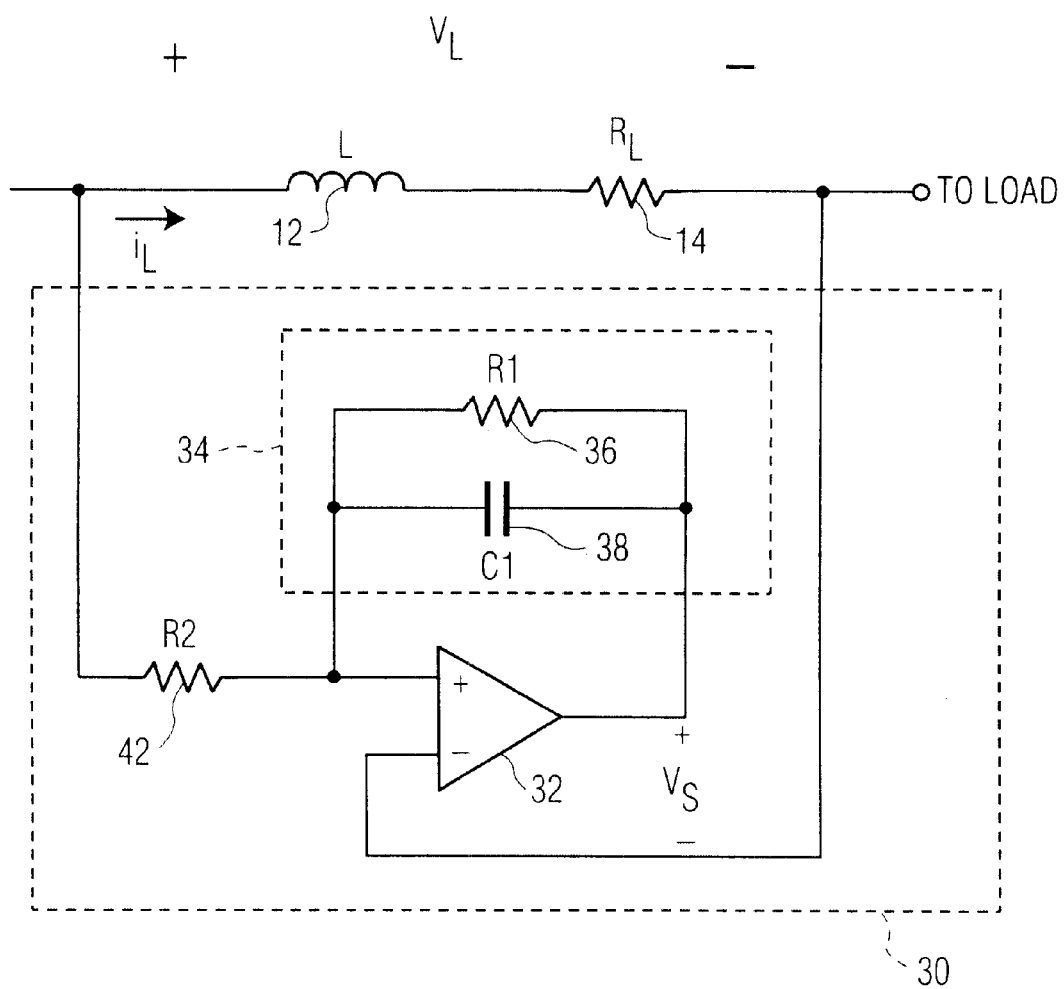
FIG. 3 shows a measuring circuit according to a first embodiment of the invention.

FIG. 3 shows a current measuring circuit 30 according to a first embodiment of the invention. Circuit 30 includes an op-amp 32, a RC network 34 comprising a resistor 36 and a capacitor 38, and a resistor 42. RC network 34 is connected in a feedback loop of op-amp 32. Resistor 42 is a scaling resistor used for selecting the appropriate gain of circuit 30.

To measure the inductor current $i_L$, the inductor voltage $V_L$ across inductor L and its internal resistor $R_L$ are first determined. In a DC mode, the voltage $V_L$ can be derived from $V_S/V_L=R1/R2$, where $V_L=i_L \cdot R_L$. Thus, $i_L=V_S \cdot R2/(R1 \cdot R_L)$.

In an AC mode, the inductor voltage can be derived from $V_S/V_L=Z1/R2$, where $Z1=R1/(1+j\omega R1 \cdot C1)$ is the total impedance of the RC network 34. In rewriting the expression $V_S/V_L=Z1/R2$, the following equation is obtained:

$$V_L/R2=V_S/Z1$$

where $V_L=i_L(j\omega L+R_L)=i_L(j\omega L+R_L) \cdot R_L/R_L=i_L \cdot R_L(1+j\omega L/R_L)$, Thus, $$i_L \cdot R_L(1+j\omega L/R_L)/R2=V_S/(R1/(1+j\omega R1 \cdot C1))$$

or, $$i_L \cdot R_L(1+j\omega L/R_L)/R2=V_S(1+j\omega R1 \cdot C1)/R1$$

In the above expression, if $R1 \cdot C1$ is chosen to be equal to $L/R_L$, then $$i_L \cdot R_L/R2=V_S/R1$$

or, $$i_L=V_S \cdot R2/(R1 \cdot R_L).$$

This expression is true for both DC and AC modes. Thus, $i_L$ can be obtained with this expression, independent of any frequencies of the AC signals. With the present invention, the inductor current $i_L$ can be accurately measured with minimum losses since no additional resistor is used in series with the inductor.

Figure 4:
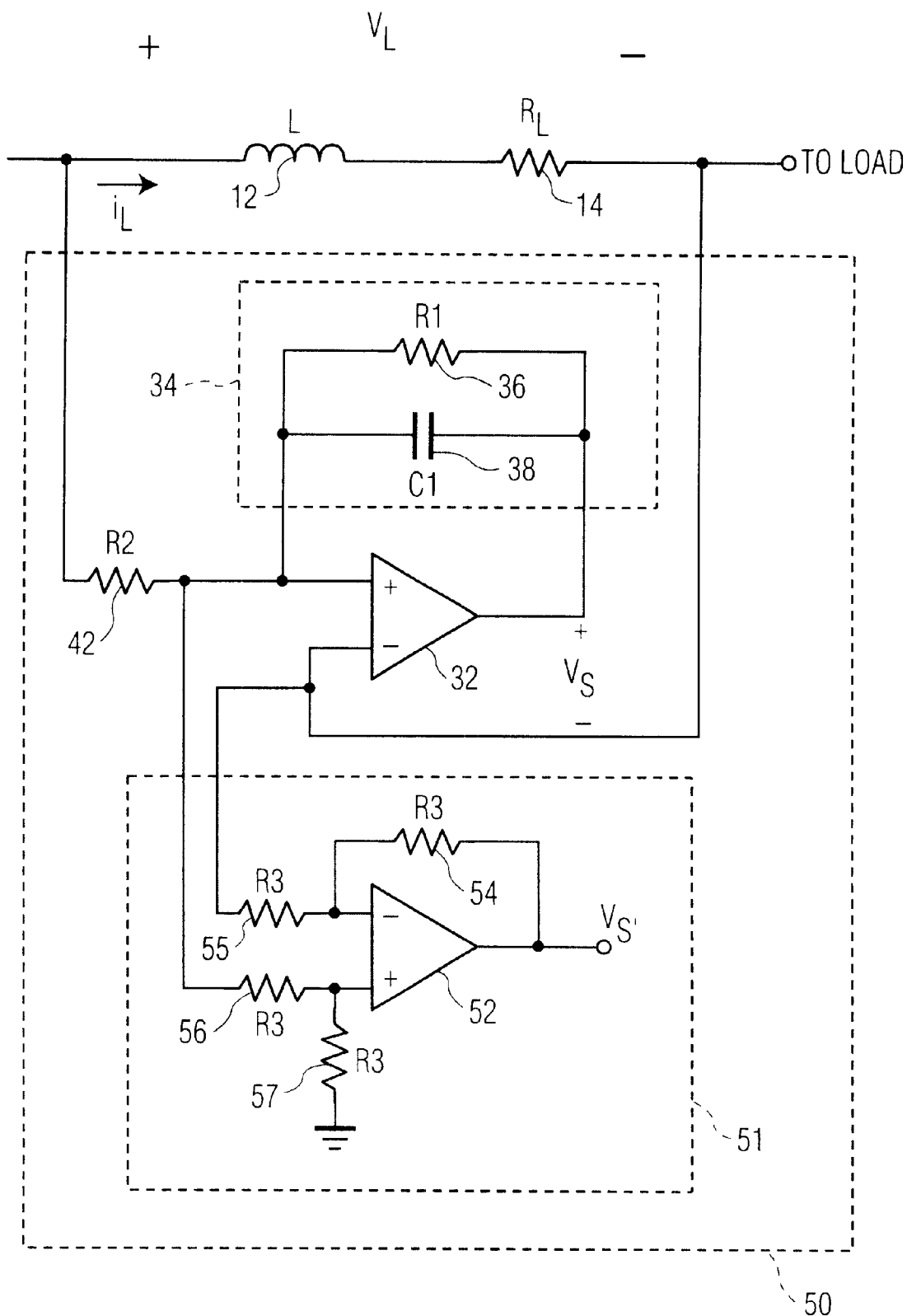
FIG. 4 shows a measuring circuit according to second embodiment of the invention.

FIG. 4 shows a current measuring circuit 50 according to a second embodiment of the invention. This embodiment is suitable for measuring the current of an inductor which has neither terminal grounded. In this embodiment, a buffer circuit 51 with a unity gain is added to the first embodiment in FIG. 3. Buffer circuit 51 includes an op-amp 52 and four resistors 54–57 of the same resistance value R3. Buffer circuit 51 provides an output voltage $V_S'$ with a ground reference, which is equivalent to the output voltage $V_S$ of op-amp 32. The ground reference is required in many applications.

Figure 5:
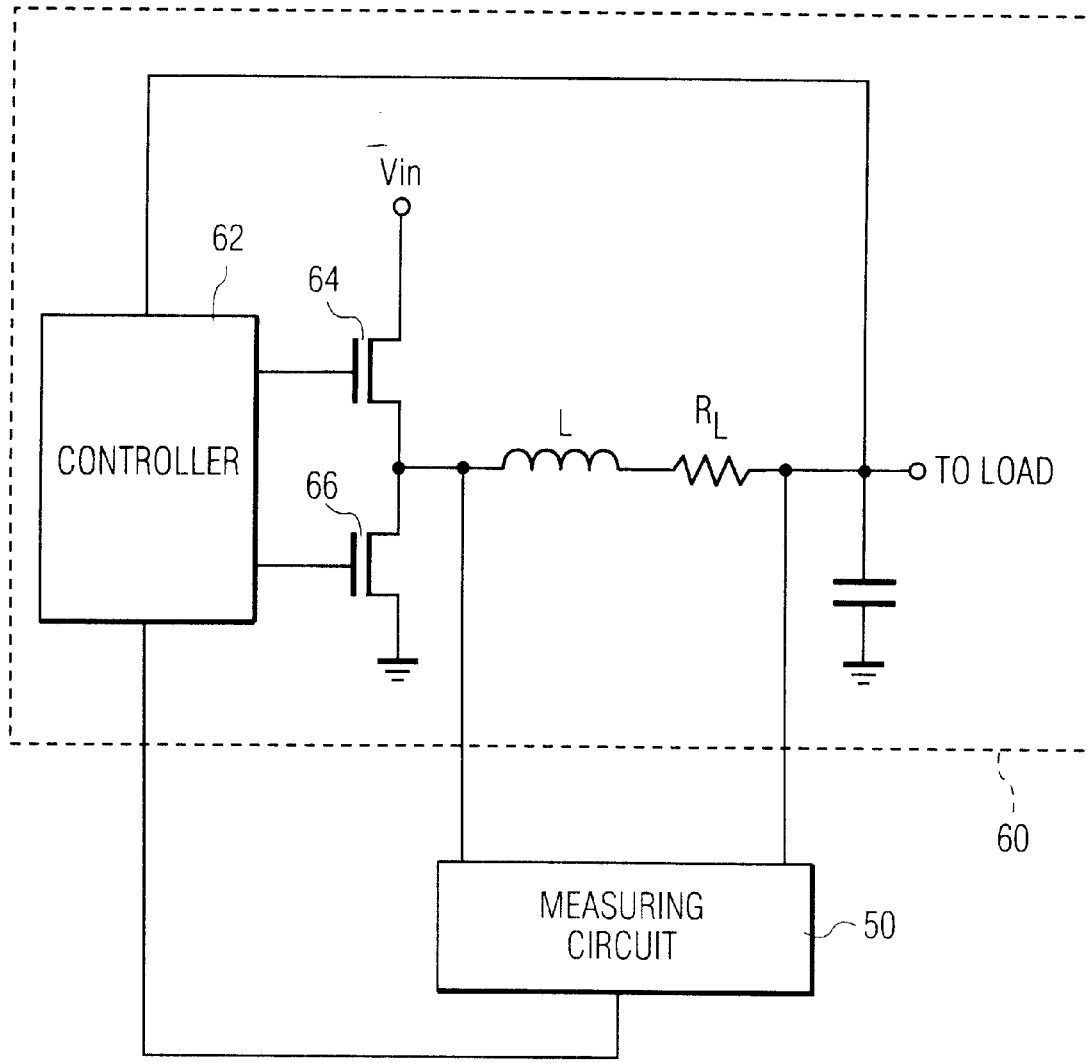
FIG. 5 illustrates an application of the second embodiment of the invention in a buck converter.

FIG. 5 illustrates an application of current measuring circuit 50 of the second embodiment of the invention in a buck converter 60. As illustrated in FIG. 5, a controller 62 controls, via transistors 62 and 64, the charging and discharging phases of converter 60, based on the value of the inductor current as measured by measuring circuit 50. The invention may also be used in a converter with a boost topology.

While the invention has been described in conjunction with specific embodiments, it is evident that many alternatives, modifications and variations will be apparent to those skilled in the art in light of the foregoing description. Accordingly, it is intended to embrace all such alternatives, modifications and variations as fall within the spirit and scope of the appended claims.

What is claimed is:

1. A measuring circuit for measuring a current of an inductor having an internal resistance, the inductor having a first end and a second end, the circuit comprising:

an op-amp having first and second input terminals and an output terminal, with the second terminal for connecting the first end of the inductor;

an RC network connected between the first input terminal and the output terminal of the op-amp; and a scaling resistor having a first end connected to the first input terminal of the op-amp and a second end for connecting to the second end of the inductor;

wherein the RC network comprises a resistor and a capacitor connected to each other in parallel; and wherein a product of the values of the resistor and capacitor of the RC network is equal to a ratio of the inductor value over the internal resistance of the inductor.

2. The circuit of claim 1, further comprising a buffer circuit operably coupled to the op-amp for providing an output voltage with a ground reference, which is equivalent to the voltage at the output terminal of the op-amp.

3. The circuit of claim 2, wherein the buffer circuit comprises an op-amp having a first input terminal, a second input terminal, and an output terminal; a first resistor coupled between the output terminal and the first input terminal; a second resistor coupled between the second input terminal and ground; a third resistor having a first terminal coupled to the first input terminal of the op-amp; and a fourth resistor having a first terminal coupled to the second input terminal of the op-amp; wherein the first, second, third, and fourth resistors have the same value.

4. The circuit of claim 3, wherein the first and second input terminals of the op-amp are respectively negative and positive terminals of the op-amp.

5. The circuit of claim 1, wherein in both DC and AC modes of operation the inductor current is derived from the following expression:

$$i_L = V_S \cdot R2/(R1 \cdot R_L)$$

wherein $i_L$ is the inductor current, $V_S$ is a voltage at the output terminal of the op-amp, R1 is the value of the resistor in the RC network, R2 is the value of the scaling resistor, and $R_L$ is the internal resistance of the inductor.

6. The circuit of claim 5, wherein the first and second terminals of the op-amp are respectively positive and negative terminals of the op-amp.

7. A measuring circuit for measuring a current of an inductor having an internal resistance, the inductor having a first end and a second end, the circuit comprising:

op-amp means having first and second input terminals and an output terminal, with the second terminal for connecting the first end of the inductor;

RC network means connected between the first input terminal and the output terminal of the op-amp means; and scaling resistor means having a first end connected to the first input terminal of the op-amp means and a second end for connecting to the second end of the inductor;

wherein the RC network means comprises a resistor and a capacitor connected to each other in parallel; and wherein a product of the values of the resistor and capacitor of the RC network means is equal to a ratio of the inductor value over the internal resistance of the inductor.

8. The circuit of claim 7, wherein in both DC and AC modes of operation the inductor current is derived from the following expression:

$$i_L V_S \cdot R2/(R1 \cdot R_L)$$

wherein $i_L$ is the inductor current, $V_S$ is a voltage at the output terminal of the op-amp means, R1 is the value of the resistor in the RC network means, R2 is the value of the scaling resistor means, and $R_L$ is the internal resistance of the inductor.

9. The circuit of claim 8, wherein the first and second terminals of the op-amp means are respectively positive and negative terminals of the op-amp means.

10. A converter, comprising:

an input circuit for receiving input signals;

an output circuit including an inductor having an internal resistance, the inductor having a first end and a second end;

a control circuit for controlling the input circuit based on a current of the inductor; and a measuring circuit for measuring the inductor current, the measuring circuit including:

an op-amp having first and second input terminals and an output terminal, with the second terminal for connecting the first end of the inductor;

an RC network connected between the first input terminal and the output terminal of the op-amp; and a scaling resistor having a first end connected to the first input terminal of the op-amp and a second end for connecting to the second end of the inductor;

wherein the RC network comprises a resistor and a capacitor connected to each other in parallel; and wherein a product of the values of the resistor and capacitor of the RC network is equal to a ratio of the inductor value over the internal resistance value of the inductor.

11. The converter of claim 10, wherein in both DC and AC modes of operation the inductor current is derived from the following expression:

$$i_L = V_S \cdot R2/(R1 \cdot R_L)$$

wherein $i_L$ is the inductor current, $V_S$ is a voltage at the output terminal of the op-amp, R1 is the value of the resistor in the RC network, R2 is the value of the scaling resistor, and $R_L$ is the internal resistance of the inductor.

12. The converter of claim 11, wherein the measuring circuit further comprises a buffer circuit operably coupled to the op-amp for providing an output voltage with a ground reference, which is equivalent to the voltage at the output terminal of the op-amp.

13. A method for measuring a current of an inductor having an internal resistance, the inductor having a first end and a second end, comprising:
- connecting an RC network between a first input terminal and an output terminal of an op-amp;
- connecting the output terminal of the op-amp to the first end of the inductor; and
- connecting a first end of a scaling resistor to the first input terminal of the op-amp and a second end of the scaling resistor to the second end of the inductor;
- wherein the RC network comprises a resistor and a capacitor connected to each other in parallel; and
- wherein a product of the values of the resistor and capacitor of the RC network is equal to a ratio of the inductor value over the internal resistance value of the inductor.

14. The method of claim 13, further comprising, in both DC and AC modes of operation, deriving the inductor current from the following expression:

$$i_L = V_S \cdot R2 / (R1 \cdot R_L)$$

wherein $i_L$ is the inductor current, $V_S$ is a voltage at the output terminal of the op-amp, R1 is the value of the resistor in the RC network, R2 is the value of the scaling resistor, and $R_L$ is the internal resistance of the inductor.

* * * * *